(12) United States Patent
Piirainen et al.

(10) Patent No.: US 6,473,016 B2
(45) Date of Patent: Oct. 29, 2002

(54) METHOD AND APPARATUS FOR IMPLEMENTING AUTOMATIC GAIN CONTROL IN A SYSTEM

(75) Inventors: Olli Piirainen; Markku Tirkkonen, both of Oulu (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/851,429

(22) Filed: May 9, 2001

(65) Prior Publication Data

US 2001/0050625 A1 Dec. 13, 2001

Related U.S. Application Data

(63) Continuation of application No. PCT/FI99/00938, filed on Nov. 11, 1999.

(30) Foreign Application Priority Data

Nov. 12, 1998 (FI) .................................................. 982455

(51) Int. Cl.[7] ............................ H03M 1/62; H03M 1/84
(52) U.S. Cl. ........................................ 341/139; 341/118
(58) Field of Search ................................. 341/139, 155, 341/144, 118, 120

(56) References Cited

U.S. PATENT DOCUMENTS

| | | | |
|---|---|---|---|
| 3,813,609 A | 5/1974 | Wilkes et al. ................. 330/91 |
| 3,931,584 A | 1/1976 | Motley et al. ............... 330/129 |
| 4,482,973 A | 11/1984 | Unagami et al. .............. 708/3 |
| 4,831,378 A | * 5/1989 | Baars et al. ................. 341/139 |
| 5,365,233 A | 11/1994 | Schaub ........................ 341/139 |
| 5,389,927 A | * 2/1995 | Turney et al. ............... 341/139 |
| 5,467,231 A | * 11/1995 | Nash et al. .................... 360/46 |
| 5,627,857 A | 5/1997 | Wilson ........................ 375/219 |
| 5,761,251 A | 6/1998 | Wender ....................... 375/345 |
| 5,828,328 A | 10/1998 | Marks ......................... 341/139 |
| 6,249,554 B1 | * 6/2001 | Mobin et al. ................ 375/345 |
| 6,292,120 B1 | * 9/2001 | Painchaud et al. .......... 341/139 |

FOREIGN PATENT DOCUMENTS

WO    WO 98/00996    1/1998

* cited by examiner

Primary Examiner—Peguy Jeanpierre
(74) Attorney, Agent, or Firm—Pillsbury Winthrop LLP

(57) ABSTRACT

The invention relates to a method and an apparatus for implementing automatic gain control in a system where an analog signal is converted into a digital signal. The apparatus comprises means (208) for performing automatic gain control of the adjustable signal in an analog manner using a gain control step of predetermined size and means (446, 448) for performing inverse gain control of the digitized signal in such a way that, after the digital adjustment, the power of the signal is the same as before the analog adjustment. To enable an accurate gain control, the apparatus further comprises means (410, 412, 214, 420) for determining the maximum energy of the signal during a predetermined measurement period, means (426, 428) for comparing the determined maximum energy to preset threshold values (430, 432), and means (436) for performing an automatic gain control of the analog signal and a compensation for the gain control to the digital signal, if the measured value exceeds the threshold.

19 Claims, 3 Drawing Sheets

METHOD AND APPARATUS FOR IMPLEMENTING AUTOMATIC GAIN CONTROL IN A SYSTEM

This application is a Continuation of International Application PCT/FI99/00938 filed Nov. 11, 1999 which designated the U.S. and was published under PCT Article 21(2) in English.

FIELD OF THE INVENTION

The invention relates to a method and an apparatus for implementing automatic gain control in a system where an analog signal is converted into a digital signal.

BACKGROUND OF THE INVENTION

The present invention relates to systems and apparatuses using analog-to-digital converters. Analog-to-digital converters comprise a certain converter-specific dynamic area, which should be fully utilized, if an optimal performance is desired. If the strength of a signal coming into a converter varies much, problems appear with the utilization of the dynamic area of the converter. Too strong signals are cut off and low-power signals do not utilize the capacity of the converter well. For this reason, the signal power at the input of the converter shall be adjusted dynamically. In this connection, power adjustment is generally called Automatic Gain Control AGC.

U.S. Pat. No. 4,851,842 discloses a prior art solution for implementing automatic gain control in connection with an analog-to-digital converter. An analog signal is monitored and adjusted by means of an adjustable preamplifier and a compensation for the automatic gain control is performed to the digital signal at the output of the converter.

U.S. Pat. No. 3,813,609 discloses another prior art solution for implementing automatic gain control in connection with an analog-to-digital converter. On the basis of a digital output signal of the converter, the power level of an analog signal is adjusted at the input of the converter.

U.S. Pat. No. 5,365,233 discloses a further prior art solution for implementing automatic gain control in connection with an analog-to-digital converter. On the basis of the absolute value of a digital output signal of the converter, the power level of an analog signal is adjusted at the input of the converter.

The present invention can preferably be applied to digital telecommunication, in particular. When time slot-based traffic is used for data transmission, it is preferable that the power of a signal received by a receiver remains constant during the whole time slot. This is essential for the operation of a frequency corrector. In known AGC systems applied to GSM systems, for instance, the power is adjusted once during a time slot. Automatic gain control has generally been based on the power of the first bits of time slots. However, because the power of a signal coming from an antenna can vary much during a time slot, the average power is set to be so low in the known systems that even possible peak powers are situated within the dynamic area of an A/D converter. For this reason, the dynamic area of the A/D converter will be very poorly utilized on an average, because the most significant bits are hardly used at all. The resolution of the converter is then bad.

A drawback of the known methods used in digital systems is also that they function poorly in conjunction with connection establishment bursts. Connection establishment bursts, i.e. access bursts, may be located at a random place of a time slot, in which case the automatic gain control cannot work efficiently.

BRIEF DESCRIPTION OF THE INVENTION

Accordingly, an object of the invention is to implement a method and an apparatus for realizing the method in such a way that the above problems can be solved. This is achieved by the method of the invention for implementing automatic gain control in a system where an analog signal is converted into a digital signal and where automatic gain control of the adjustable signal is performed in an analog manner using a gain control step of predetermined size and where inverse gain control of the digitized signal is performed in such a way that, after the digital adjustment, the power of the signal is the same as before the analog adjustment. In the method of the invention, the maximum energy of the signal is determined during a predetermined measurement period, the determined maximum energy is compared to preset threshold values, and in case if the measured value exceeds the threshold, an automatic gain control of the analog signal is performed and the digital signal is compensated for the gain control.

Another object of the invention is an apparatus for implementing automatic gain control in a system where an analog signal is converted into a digital signal and which system comprises means for performing automatic gain control of the adjustable signal in an analog manner using a gain control step of predetermined size and means for performing inverse gain control of the digitized signal in such a way that, after the digital adjustment, the power of the signal is the same as before the analog adjustment. The apparatus of the invention comprises means for determining the maximum energy of the signal during a predetermined measurement period, means for comparing the determined maximum energy to preset threshold values and means for initiating an automatic gain control of the analog signal and a compensation for the gain control to the digital signal, if the measured value exceeds the threshold.

Preferred embodiments of the invention are set forth in dependent claims.

Several advantages are achieved by the method and apparatus according to the invention. Because, in the solution of the invention, automatic gain control is performed continuously using a measurement period for averaging measurement results, the solution of the invention is capable of reacting to a power changing during a time slot. By means of the solution, the power can be kept constant during a time slot essentially better than before. In a preferred alternative embodiment of the invention, it is possible to alleviate this effect of power level vibration occurring at the control of the power level.

BRIEF DESCRIPTION OF THE FIGURES

The invention will now be described in more detail by means of preferred embodiments, referring to the attached drawings, where.

DETAILED DESCRIPTION OF THE INVENTION

The present invention can be applied to any arrangement using analog-to-digital converters, but the advantages of the invention appear best when it is applied to digital data transmission systems, such as GSM system.

Figure 1:
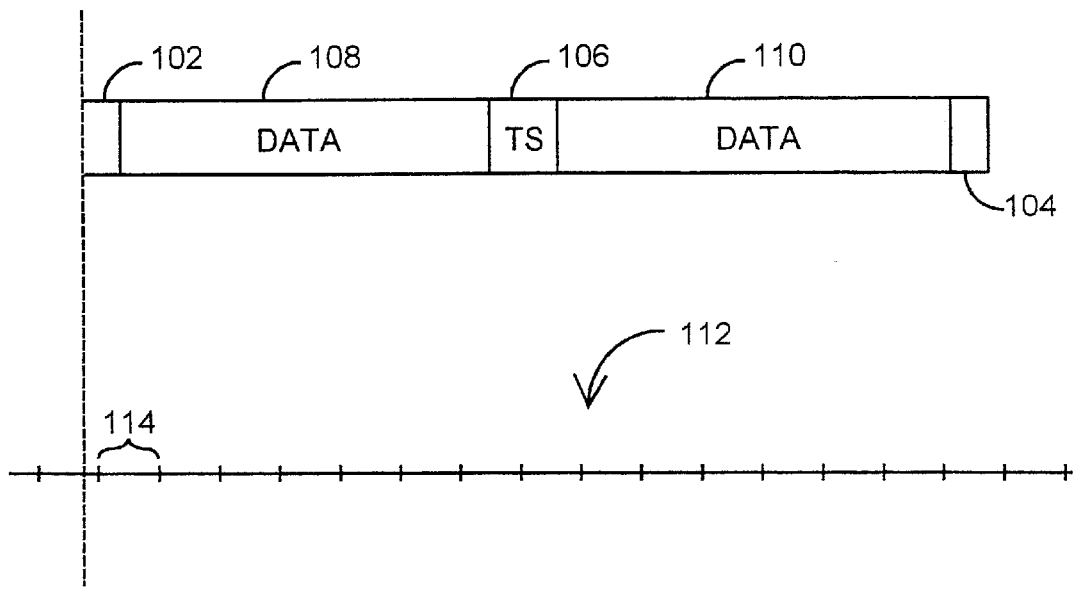
FIG. 1 shows a time slot of a GSM system and an example of a measurement period.

FIG. 1 illustrates the structure of a GSM time slot. A time slot 100 comprises start and stop bits 102, 104, a training sequence 106 in the middle of the time slot and two data fields 108, 110 containing the actual information to be transferred. The training sequence 106 is used for estimating an impulse response of a transmission channel and, therefore, the power should remain constant during the time slot. In prior art solutions, the power of a time slot has been adjusted on the basis of the start bits 102. This has not led to a satisfactory final result, however.

In the solution of the present invention, automatic gain control utilizes a measurement period of predetermined length. In a preferred embodiment of the invention, the length of the measurement period is substantially shorter than the length of a time slot. FIG. 1 illustrates this with a line segment 112, representing successive measurement periods. The length of one measurement period 114 is considerably shorter than the time slot.

In the solution of the invention, the maximum energy of a received signal is determined during a predetermined measurement period, and AGC adjustment is performed on the basis of this measurement result. The determined maximum energy of the measurement period is compared to preset threshold values. In a preferred embodiment of the invention, two threshold values are used, one for increasing and the other one for decreasing the power. The threshold values can be of different sizes. If a determined value of the maximum energy of a measurement period exceeds either threshold, an automatic gain control of the analog signal is performed and, respectively, the digital signal is compensated for the gain control.

Figure 2:
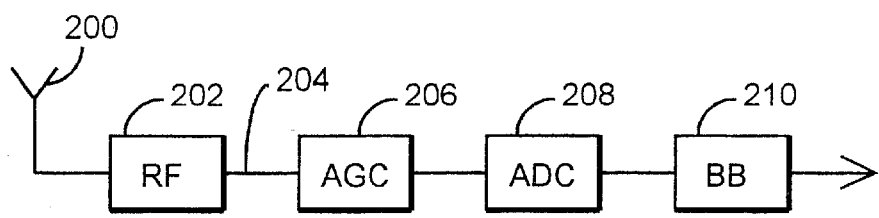
FIG. 2 illustrates a receiver, to which the invention can be applied.

As an example, a receiver of a digital telecommunications system is examined next by means of FIG. 2, to which receiver the invention can be applied. The receiver comprises an antenna 200, by which a desired signal is received. The signal is brought to radio frequency parts 202, where the signal is filtered and converted into an intermediate frequency. From the radio frequency parts, the signal 204 is brought to an AGC circuit 206, which adjusts the signal power before an analog-to-digital converter 208. From the converter, the digitized signal is brought to baseband parts 210, where the signal power is measured, the AGC circuit is controlled and the automatic gain control performed by the AGC circuit is compensated for. From the baseband parts 208, the signal is brought further to the other parts of the receiver, such as a detector. These are not shown in the figures, because they are not relevant for the invention.

Figure 3:
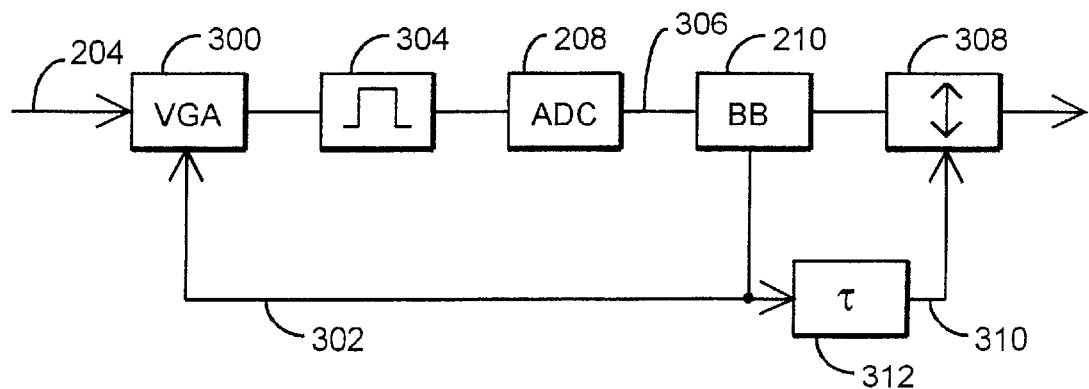
FIG. 3 illustrates an arrangement for implementing AGC.

FIG. 3 illustrates in more detail an arrangement for implementing AGC in the receiver of FIG. 2. A signal 204 coming from radio frequency parts is at first brought to a voltage-controlled amplifier 300 amplifying the signal in accordance with a control signal 302. The amplified signal is brought to a bandpass filter 304 and from there further to an analog-to-digital converter 208, where the analog signal received by an antenna is converted into digital form. The digitized signal 306 is brought to baseband parts 210, where the signal power is measured in the manner to be described below and the AGC is adjusted. From the baseband parts 210, the control signal 302 proceeds to the voltage-controlled amplifier 300. From the baseband parts, the signal is brought to a compensation 308 for the AGC adjustment, whereby the gain control of the voltage-controlled amplifier is cancelled in order to bring the signal to the original form. A control signal 310 comes from the baseband parts via a delay element 312 to the compensation 308 for the gain control. The delay shall have the same length as it takes the signal to proceed from the voltage-controlled amplifier to the compensation parts.

Figure 4:
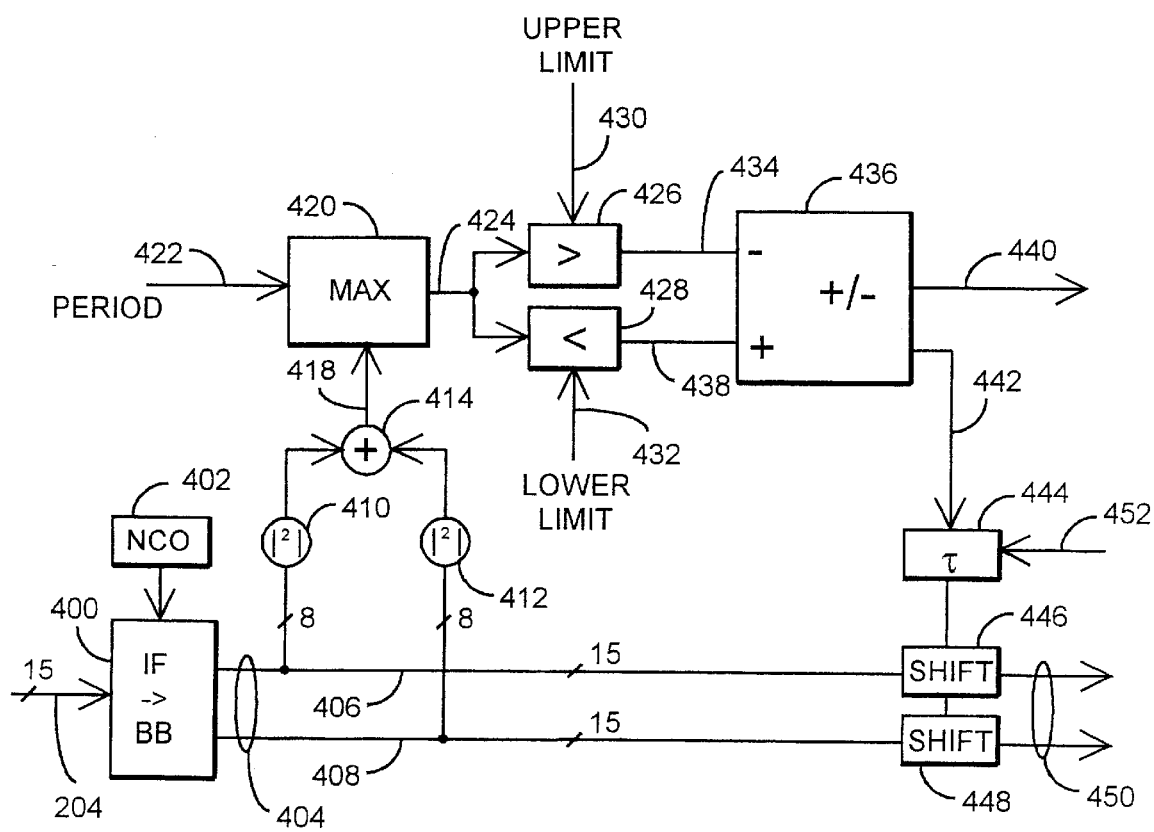
FIG. 4 shows an example of an apparatus according to the invention.

In FIG. 4, a block diagram illustrates an example of an implementation of the solution of the invention. In a preferred embodiment of the invention, an intermediate frequency signal 204 coming from radio frequency parts is initially brought to a frequency converter 400, which, controlled by a numerically controlled oscillator 402, converts the signal into a baseband signal 404. The signal 404 is a complex signal comprising both an I and a Q branch 406, 408. In the solution of the invention, each branch 406, 408 is connected to a separate calculator 410, 412, determining the square of the absolute value of the signal. The obtained values are brought to a summer 414, and a sum 418, obtained in this way and representing the signal power, is brought to a comparator 420. The length 422 of a measurement period is also inputted to the comparator 420. During a measurement period, the comparator determines the maximum power of the signal and transfers it to its output 424. The maximum power value is brought to a first and second threshold detector 426, 428. A preset upper limit threshold value 430 is also inputted to the first threshold detector 426. In the first threshold detector 426, the maximum power is compared to the given threshold value 430, and if the limit is exceeded, a gain control decrease signal 434 is connected to a control unit 436. A preset lower limit threshold value 432 is also inputted to the second threshold detector 428. In the second threshold detector 428, the maximum power is compared to the given threshold value 432, and if it is below the limit, a gain control increase signal 438 is connected to the control unit 436. On the basis of the signals of the threshold detectors, the control unit 436 sends a power modification command 440 to the voltage-controlled amplifier. Correspondingly, the control unit 436 sends a gain control compensation signal 442.

Accordingly, a voltage-controlled amplifier adjusts an analog signal at the input of an analog-to-digital converter. In the solution of the invention, automatic gain control is performed using a gain control step of predetermined size. In a preferred embodiment of the invention, the control step is 6 dB. Compensation to the digital signal can then preferably be performed as a bit transfer. By transferring bits downwards by one bit (i.e. by rejecting the least significant bit), a power drop of 6 dB is provided.

Consequently, in the solution of the invention, a gain control compensation signal is at first brought to a delay element 444, where the compensation signal is delayed as much as the adjustable signal needs time to move from the voltage-controlled amplifier to the compensation means. The delay of the delay element may also be adjustable by a control signal 452. From the delay element 444, the control proceeds to shift registers 446, 448, there are one of them for each branch. In the registers, the digital signal is shifted to either direction on the basis of the control, whereby the analog gain control can be compensated for. From the registers 446, 448, the signal 450 is brought further to the other parts of the receiver.

In the preferred embodiment of the invention, the calculators 410, 412 utilize only the most significant bits of the signal for determining the maximum energy. In the example case of the figure, only eight most significant bits are thus brought to the calculators.

Figure 5:
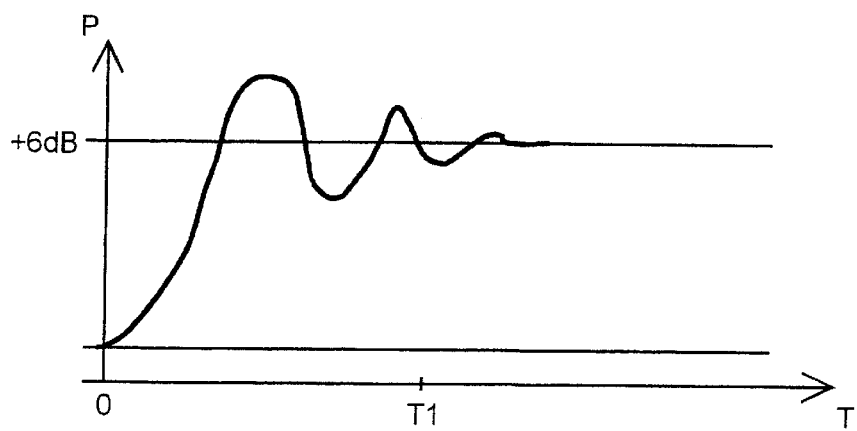
FIG. 5 illustrates the setting time of signal power at control.

Accordingly, the voltage-controlled amplifier adjusts an analog signal at the input of an analog-to-digital converter preferably by steps of 6 dB. FIG. 5 illustrates the behavior of the power at automatic gain control. In the example of the figure, the horizontal axis representing time and the vertical axis power, the power is increased by one step. At moment 0, a gain control command is given, and the power rises 6 dB. Because of the properties of the amplifier, vibration often occurs at gain control, before the power achieves the desired higher power level at moment T1.

In a preferred alternative embodiment of the invention, it is possible to alleviate this effect of power level vibration. In the method of the invention, after an analog gain control (at the moment 0 in the example of FIG. 5), the digital signal is kept constant at its previous value during the vibration and the gain-compensated digital signal is not connected forward until at the moment T1, when the vibration of the power level has subsided.

Figure 6:
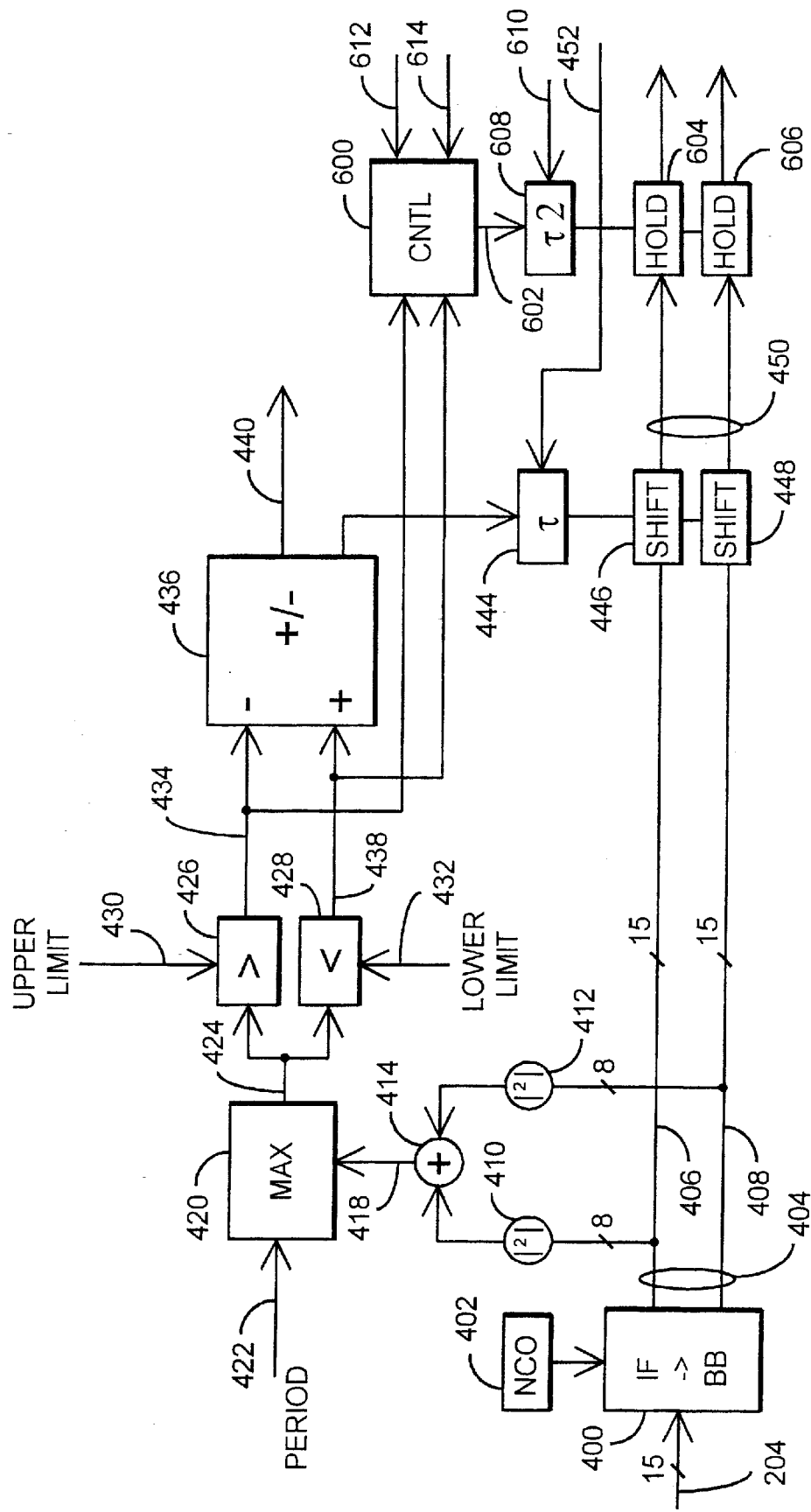
FIG. 6 presents another example of the apparatus of the invention.

This alternative embodiment of the invention is illustrated in FIG. 6. In FIG. 6, output signals 434, 438 of a first and a second threshold detector 426, 428 are brought, besides to a control unit 436, also to a voltage holding control circuit 600. The control circuit 600 sends a holding command and a command canceling the holding 602 to holding circuits 604, 606 of the branches I and Q. The commands pass through a second delay element 608. In the delay element 608, the signal is delayed as much as the adjustable signal needs time to move from a voltage-controlled amplifier to compensation means. The delay of the delay element can also be adjustable by a control signal 610. A control signal 612, informing whether hold is used or not, and information 614 on the necessary length of the hold are also input in the holding control circuit. The holding circuits can be implemented by methods known to one skilled in the art.

In another alternative embodiment of the invention, hold is not used, but samples are zeroed during vibration. The operation is otherwise similar to the above, except that the holding circuits 604, 606 then are zeroing elements. The implementation can occur by methods known to one skilled in the art.

In a further alternative embodiment of the invention, neither hold nor zeroing is used, but the digital signal is interpolated during vibration. Then, the control circuit 600 interpolates the signal by means of the former and possibly also the latter signal samples. The interpolation may take place using mathematical methods. The operation is like above, except that the holding circuits 604, 606 then are compensation elements of the sample. The implementation can occur by methods known to one skilled in the art.

Though the invention has been described above referring to the example of the attached drawings, it is obvious that the invention is not restricted to that, but it can be varied in many ways within the inventive idea set forth in the attached claims.

What is claimed is:

1. A method for implementing automatic gain control in a system where an analog signal is converted into a digital signal and where automatic gain control of an adjustable signal is performed in an analog manner using gain control of a predetermined size and where inverse gain control of the digital signal is performed such that the power of the adjustable signal after digital adjustment is the same as before the analog adjustment, the method comprising:

determining a maximum energy of the adjustable signal during a predetermined measurement period;

comparing the determined maximum energy to at least one preset threshold value; and initiating an automatic gain control of the analog signal and a compensation for the automatic gain control to the digital signal, if the determined maximum energy exceeds the at least one preset threshold value.

2. The method according to claim 1, wherein at least one preset threshold value includes one threshold value for power decrease and another threshold value for power increase, wherein the one threshold value for power decrease and the other threshold value for power increase are of different size.

3. The method according to claim 1, wherein frequency transformation of the digital signal is performed before gain control measurements.

4. The method according to claim 1, wherein the system is a digital data transmission system and automatic gain control of a complex signal occurs at baseband.

5. The method according to claim 1, wherein energy of the adjustable signal is determined by calculating a square of the absolute value of the adjustable signal.

6. The method according to claim 5, wherein the adjustable signal comprises a plurality of separate branches and the energy of the adjustable signal is determined by calculating a square of an absolute value of each of the plurality of separate branches to obtain a separate value for each separate branch and by summing the calculated separate values.

7. The method according to claim 1, wherein the determination of the maximum energy uses only significant bits of the adjustable signal.

8. The method according to claim 1, wherein the adjustable signal comprises time slots and the predetermined measurement period has a length that is substantially shorter than one time slot.

9. The method according to claim 1, wherein the digital signal is kept constant during the automatic gain control until a vibration of the automatic gain control has subsided.

10. The method according to claim 1, wherein the digital signal is kept at zero during the automatic gain control until a vibration of the automatic gain control has subsided.

11. The method according to claim 1, further comprising interpolating the digital signal during the automatic gain control until a vibration of the automatic gain control has subsided.

12. The method according to claim 11, wherein at least one digital sample of the digital signal is utilized for the interpolating.

13. An apparatus for implementing automatic gain control in a system where an analog signal is converted into a digital signal and which system includes means for performing automatic gain control of an adjustable signal in an analog manner using gain control of a predetermined size and means for performing inverse gain control of the digital signal such that the power of the adjustable signal after digital adjustment is the same as before analog adjustment, the apparatus comprising:

means for determining a maximum energy of the adjustable signal during a predetermined measurement period;

means for comparing the determined maximum energy to at least one preset threshold value; and means for initiating an automatic gain control of the analog signal and a compensation for the automatic gain control to the digital signal, if the determined maximum energy exceeds the at least one preset threshold value.

14. The apparatus according to claim 13, further comprising frequency transformation means for performing a frequency transformation of the digital signal before gain control measurements.

15. The apparatus according to claim 13, wherein the adjustable signal comprises a plurality of separate branches and the apparatus further comprises means for calculating a square of an absolute value of each of the plurality of separate branches to obtain a separate value for each separate branch and means for summing the calculated separate values.

16. The apparatus according to claim 13, further comprising means for keeping the digital signal constant until a vibration of the automatic gain control has subsided.

17. The apparatus according to claim 13, further comprising means for keeping the digital signal at zero until a vibration of the automatic gain control has subsided.

18. The apparatus according to claim 13, further comprising interpolating means for interpolating the digital signal until a vibration of the automatic gain control has subsided, the interpolating means using at least one digital sample of the digital signal to interpolate the digital signal.

19. An apparatus to implement automatic gain control a system where an analog signal is converted into a digital signal, the system including structure to perform automatic gain control of an adjustable signal in an analog manner using gain control of a predetermined size and to perform inverse gain control of the digital signal such that the power of the adjustable signal after digital adjustment is the same as the power of the adjustable signal before analog adjustment, the apparatus comprising:

a comparator configured to determine a maximum energy of the signal during a predetermined measurement period;

at least one threshold detector configured to detect at least one preset threshold value;

the comparator being configured to compare the determined maximum energy to at least one preset threshold value; and a control unit configured to initiate an automatic gain control of the analog signal and a compensation for the automatic gain control to the digital signal, if the determined maximum energy exceeds the at least one preset threshold value.

* * * * *